(12) United States Patent
Kishiro

(10) Patent No.: US 7,105,451 B2
(45) Date of Patent: Sep. 12, 2006

(54) METHOD FOR MANUFACTURING SEMICONDUCTOR DEVICE

(75) Inventor: Koichi Kishiro, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/761,187

(22) Filed: Jan. 22, 2004

(65) Prior Publication Data

US 2005/0059237 A1    Mar. 17, 2005

(30) Foreign Application Priority Data

Sep. 17, 2003    (JP) .............................. 2003-324127

(51) Int. Cl.
*H01L 21/311* (2006.01)

(52) U.S. Cl. ...................... 438/696; 438/666; 438/618; 438/928; 438/937

(58) Field of Classification Search ................ 438/618, 438/666, 696, 928, 937
See application file for complete search history.

(56) References Cited

U.S. PATENT DOCUMENTS

| | | | | |
|---|---|---|---|---|
| 5,723,385 A | * | 3/1998 | Shen et al. ................. | 438/763 |
| 5,966,628 A | * | 10/1999 | Wei et al. ................... | 438/584 |
| 6,214,722 B1 | * | 4/2001 | Lin et al. .................... | 438/637 |
| 6,242,337 B1 | * | 6/2001 | Okada ........................ | 438/622 |
| 6,458,694 B1 | * | 10/2002 | Ogure et al. ................ | 438/652 |
| 6,472,312 B1 | * | 10/2002 | Bao et al. ................... | 438/633 |
| 2002/0063304 A1 | | 5/2002 | Toeda et al. | |

FOREIGN PATENT DOCUMENTS

| | | |
|---|---|---|
| JP | 2002-280321 | 11/1990 |
| JP | 07-161948 | 6/1995 |
| JP | 2000-077414 | 3/2000 |
| JP | 2001-177098 | 6/2001 |
| JP | 2002-164547 | 6/2002 |
| JP | 2003-017559 | 1/2003 |

OTHER PUBLICATIONS

Wolf, S. and Tauber, R.N., "Silicon Processing for the VLSI Era", vol. 1, pp. 445, 1986.*

* cited by examiner

*Primary Examiner*—Zandra V. Smith
*Assistant Examiner*—Christy Novacek
(74) *Attorney, Agent, or Firm*—VolentineFrancos& Whitt,PLLC

(57) ABSTRACT

A resist pattern formed so as to expose a wafer edge region is used to expose an edge surface region of an Si support substrate by dry etching. Next, a conductive layer constituted as wirings by subsequent patterning is formed by sputtering.

13 Claims, 6 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device, and particularly to a method for manufacturing a semiconductor device, which reduces the influence of electrical charges stored in a wafer by sputtering or dry etching or the like.

2. Description of the Related Art

In a wiring process subsequent to formation of a gate, there is generally a fear that when heat treatment is done at a high temperature, aluminum (Al), titanium (Ti), tungsten (W) or the like used as a wiring material is oxidized due to oxidizing atmosphere or an interlayer insulating film. Thus, only a temperature of 400° C. or less is applied to prevent such oxidation. A wafer is often subjected to a plasma atmosphere to perform etching at the processing temperature of such about 400° C. and deposit an insulating film while embeddability is being maintained. Also the wafer is subjected to a plasma atmosphere even at sputtering of a metal. In these plasma atmospheres, accelerated ions or electrons collide with the wafer so that electrical charges are injected into the wafer.

There is a low possibility that since a majority of electrical charges injected into the wafer flow into a support substrate if the wafer is of a normal bulk wafer, a device will charge up. Since, however, an SOI (Silicon On Insulator) wafer has a buried oxide film (BOX (Buried Oxide) oxide film) formed between a support substrate and an SOI layer on the surface of the wafer, the charges that have flown from the wafer will produce a concentration of electric field at an insulative weak point of an element or device, thus degrading reliability and breaking down an insulating film.

In the conventional semiconductor process, a gate insulating film has been thinned with miniaturization. A gate electrode per se is isolated from a silicon (Si) substrate with a gate insulating film interposed therebetween. When the charges caused by the plasma atmosphere are stored upon etching, there is a fear that the thin gate insulating film is broken down. Therefore, an apparatus used in gate etching and sidewall (Side Wall) etching is designed to such a mechanism that the charges become hard to flow into the wafer. Since high-temperature heat treatment is enabled if polysilicon is used as a gate material, the deposition of an interlayer insulating film using an LP-CVD (Low Pressure Chemical Vapor Deposition) apparatus (deposition temperature: 700° C. to 800° C.) or the like free of plasma damage and excellent in embeddability is common.

As a method for preventing damage due to charge up caused upon formation of Al wiring, for example, a conventional document has proposed a method for forming a wiring pattern across a grid line after an exposed portion has been provided in a silicon substrate on the grid line, thereby to form a current path that leads to the substrate.

There have also been proposed several methods such as a method for providing a conductive path between an SOI layer and an Si support substrate isolated by a BOX oxide film in the SOI wafer to thereby control a substrate potential. A patent document 2 has proposed a method for forming a substrate contact in a buried oxide film that insulates an SOI layer and an Si support substrate from each other. A method for forming a short-circuit conductor for bringing an Si support substrate and an SOI layer into conduction in the neighborhood of a scribe-intended region has been proposed by a patent document 3. A patent document 4 has proposed a method for cutting a scribe line to thereby bring an Si support substrate and an SOI layer disposed above a buried oxide film.

LP-CVD free of a fear of charging damage is principally used in the deposition of an interlayer insulating film in a transistor forming process. On the other hand, an AP-CVD (Atomospheric Pressure Chemical Vapor Deposition) apparatus capable of performing deposition at a relatively low temperature, begins to be developed in recent years. However, the preset apparatus involves a problem about embeddability. Dry etching is mainstream upon gate etching. An apparatus is used which makes it hard to store electrical charges in a thin gate insulating film.

However, charging damage caused by a process is not so taken into consideration at metal sputtering for a wiring process subsequent to the formation of a transistor and dry etching.

FIG. 6 is a diagram schematically showing, by a sectional partly cut area, the manner in which electrical charges are stored by deposition of a metal layer by sputtering in a wiring process employed in a method for manufacturing a semiconductor device using an SOI wafer 200. In the drawing, the left end corresponds to a wafer edge 222. A semiconductor element is not formed in a wafer edge region 224 corresponding to a peripheral region extending to about 5 mm in the direction (right direction here) of the center of the wafer as viewed from the wafer edge. A region near the wafer center from the wafer edge region 224 corresponds to a device forming region 226, where various devices are formed.

Here, the SOI wafer 200 comprises an Si support substrate 202, a BOX oxide film 204 and an SOI layer 206. The Si support substrate 202 and the SOI layer 206 are insulated from each other by the BOX oxide film 204 used as a buried oxide film. Individual devices formed in the SOI wafer 200 are separated from one another by device-to-device isolation regions 208. A detailed description thereof is omitted in FIG. 6, and a gate insulating film 210 and a gate electrode 212 are shown in FIG. 6. An interlayer insulating film 214 is deposited on the upper side of the SOI wafer 200 formed with the devices. A contact 216 for connecting to an upper wiring is formed over the gate electrode 212.

A conductive layer 218 to be subsequently formed as each wiring by patterning is deposited on the upper surfaces of the interlayer insulating film 214 and the contact 216. At this time, electrical charges (indicated by arrows as the injection 220 of the charges by sputtering in the drawing) on the wafer surface produced during sputtering are in danger of being stored in the corresponding device through the contact 216. These electrical charges will degrade insulative weak points and cause dielectric breakdown. Since the electrical charges stored in the device are isolated by the buried oxide film, there are no places to allow the charges to escape, and there is a possibility that stress greater than an assumed electric field will be applied, thus degrading reliability of each device.

The device formed according to such a process results in an unstable yield due to the occurrence of a leak current by dielectric breakdown and fluctuations in transistor characteristics.

Thus, the present invention aims to reduce storage of electrical charges by metal sputtering or dry etching, which occurs due to an insulating layer being buried in between as in an SOI wafer, thereby to prevent a reduction in device's yield due to charge up.

SUMMARY OF THE INVENTION

In order to solve the above-described problems, an edge region provided around a wafer, which is not used in device formation, i.e., a wafer edge region is used in the transfer of electrical charges during sputtering. That is, there is provided a method for manufacturing a semiconductor device, comprising, upon processing a wafer having a supporting body and an intermediate insulating film provided over the whole upper surface of the supporting body to thereby fabricate the semiconductor device, (a) a step for removing a layered portion of the intermediate insulating film, which is provided on an edge region (hereinafter called simply "wafer edge region") lying around the wafer, by etching using a resist pattern to thereby expose an edge surface region of the supporting body, which corresponds to the wafer edge region, and (b) a step for forming a conductive layer by sputtering so as to cover the exposed edge surface region and the remaining intermediate insulating film from the upper side.

Here, the wafer edge region is a peripheral region extending to about 5 mm from a wafer edge to the center of the wafer as viewed from the surface side of the wafer. This corresponds to a region not used in normal formation of each device.

According to the semiconductor device manufacturing method of the present invention, since the conductive layer deposited by sputtering is in contact with the supporting body, electrical charges produced during execution of sputtering can be escaped to the supporting body. It is thus possible to suppress deterioration of the insulating film and form each device on the wafer without impairing reliability.

Since the region of the surface of the support substrate, which is used to connect the Si support substrate and the conductive layer and extends to about 5 mm from the wafer edge to the center of the wafer, is originally a region unavailable as a device, no influence is exerted on yields even if it is etched.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

Figure 1A:
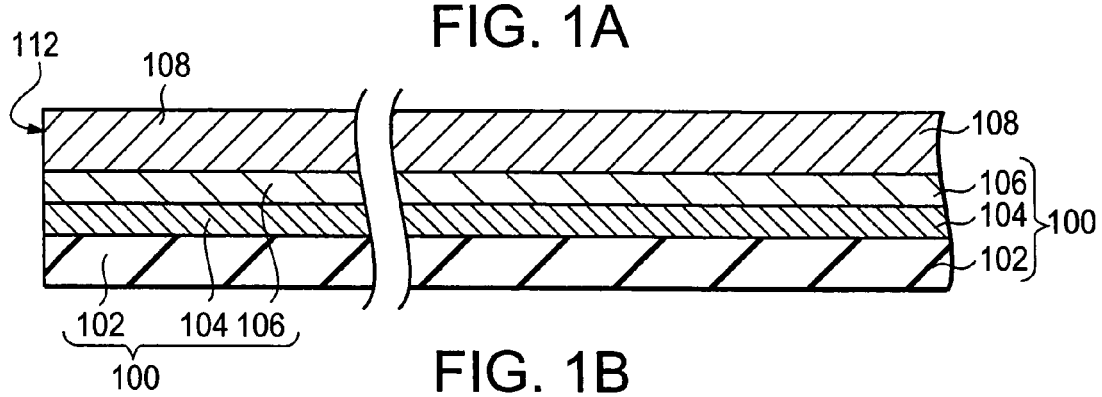
FIGS. 1(A) through 1(D) are respectively process diagrams for describing a method for manufacturing a semiconductor device, according to a first embodiment of the present invention.
Figure 1B:
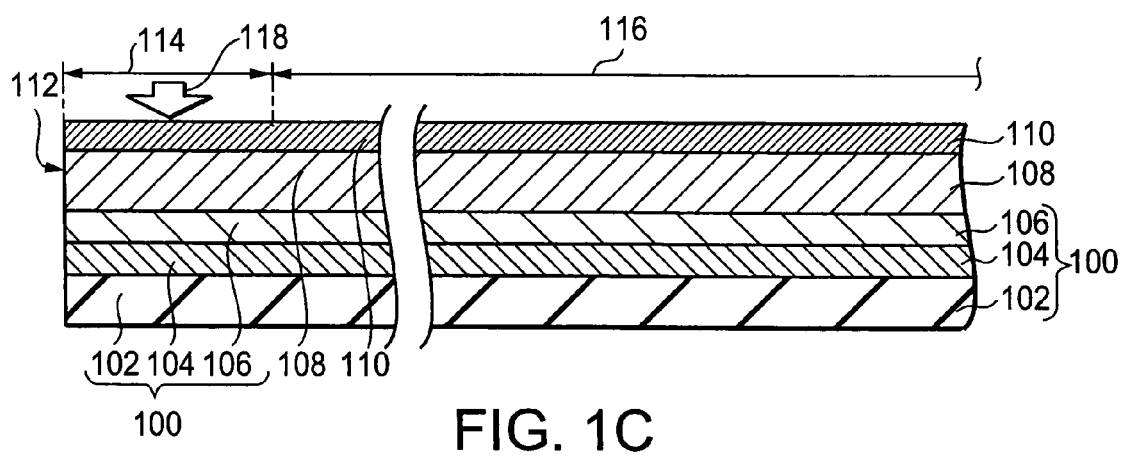

Best modes for carrying out the present invention will hereinafter be described with reference to the accompanying drawings. Incidentally, the respective drawings for describing manufacturing methods schematically show sectional cut areas of structures obtained at respective stages of manufacturing processes. Also the respective drawings schematically illustrate sizes, shapes and positional relationships of respective components constituting the structures to such a degree that the present invention can be understood. Similar components illustrated in the respective drawings are respectively identified by the same reference numerals, and the description of certain common components might be omitted.

<First Embodiment>

A method for manufacturing a semiconductor device, according to a first embodiment of the present invention will be explained with reference to FIGS. 1 and 2. The first embodiment illustrates, as an example, a process for forming wirings on an SOI wafer. Here, a description will be made, by way of illustration, of an SOI wafer 100 formed by sequentially laminating, for example, an Si support substrate 102 made of a semiconductor material, which is used as a supporting body, for example, a BOX oxide film 104 used as an intermediate insulating layer, and a conductive layer 122 used as a conductive layer formed by sputtering.

FIG. 1(A) shows a step in the middle of the process for fabricating the semiconductor device on the SOI wafer. An interlayer insulating film 108 is laminated on the upper surface of the SOI wafer 100 formed by sequentially laminating the Si support substrate 102, the BOX layer 104 and an SOI layer 106 (see FIG. 1(A)). Referring to FIGS. 1 and 2, the left end as viewed in the figures correspond to a wafer edge 112. A semiconductor element provided with device-to-device isolation regions, a gate insulating film, a gate electrode, a contact, etc. is formed in the SOI layer 106 and interlayer insulating film 108 in a device region 116 although its description is omitted here.

Next, a resist film 110 is applied onto the upper surface of the interlayer insulating film 108. The resist film 110 makes use of a positive type resist. The positive type resist is exposed over its periphery to remove a resist film portion corresponding to a wafer edge region. Only a resist edge region corresponding to the wafer edge region 114, of the resist film 110 is exposed by a peripheral exposure 118 (see FIG. 1(B)). Although each location to be exposed is limited using a mask pattern upon the normal photolitho etching, it is exposed here by a peripheral exposure function of an exposure system without using the mask pattern.

The peripheral exposure function of the exposure system corresponds to the function of exposing only the peripheral portion of the wafer, i.e., the wafer edge region employed in the present embodiment. Though the peripheral exposure function does not correspond to the function mounted to a general exposure system as standard, the peripheral exposure function can be mounted to, for example, the exposure system manufactured by Tokyo Electron Ltd.

Figure 1C:
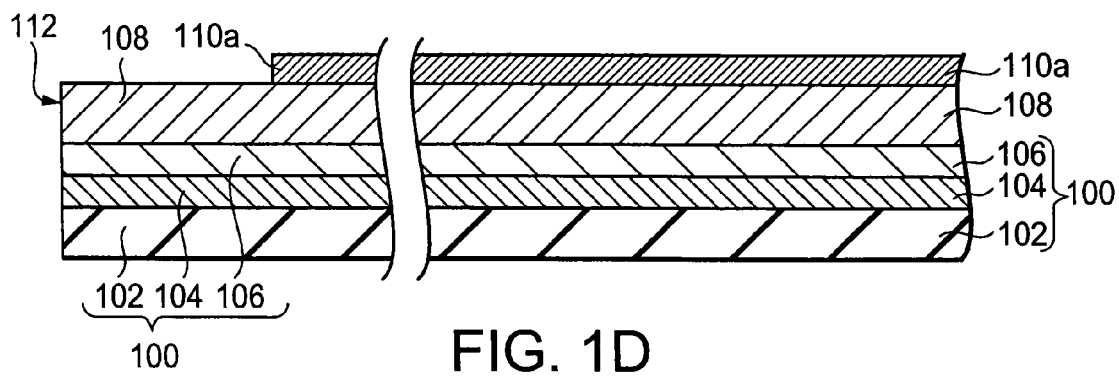
Figure 3A:
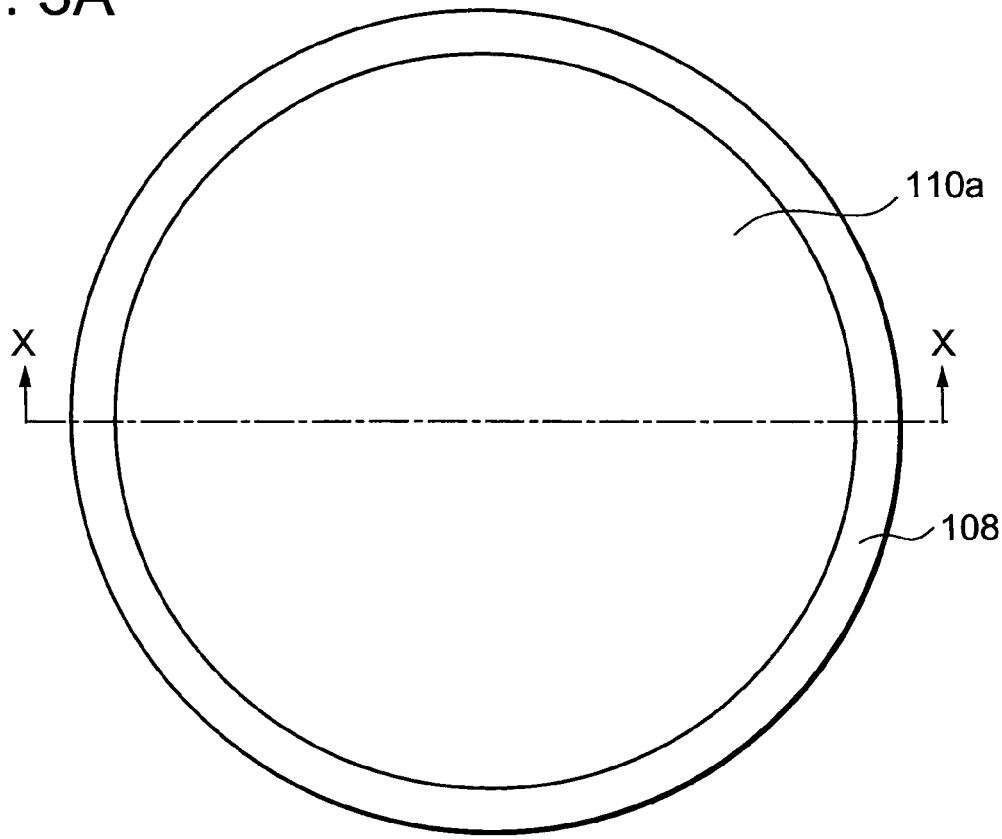
FIG. 3(A) and FIG. 3(B) are diagrams showing a structure of a resist pattern.
Figure 3B:
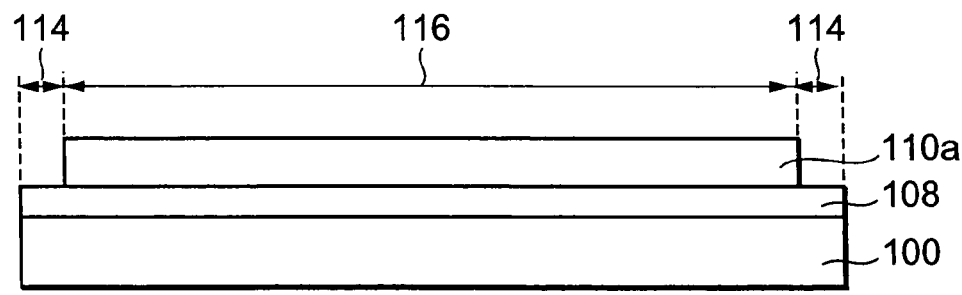

After the peripheral exposure, development processing is performed so that a resist pattern 110a can be formed (see FIG. 1(C)). The global image of the wafer formed with the resist pattern 110a is schematically illustrated in FIGS. 3(A) and 3(B). Incidentally, FIG. 3(A) is a plan view of the formed resist pattern 110a as viewed from the upper side of the wafer. FIG. 3(B) is a cross-sectional view cut along a broken line indicated by X—X of FIG. 3(A).

Figure 1D:
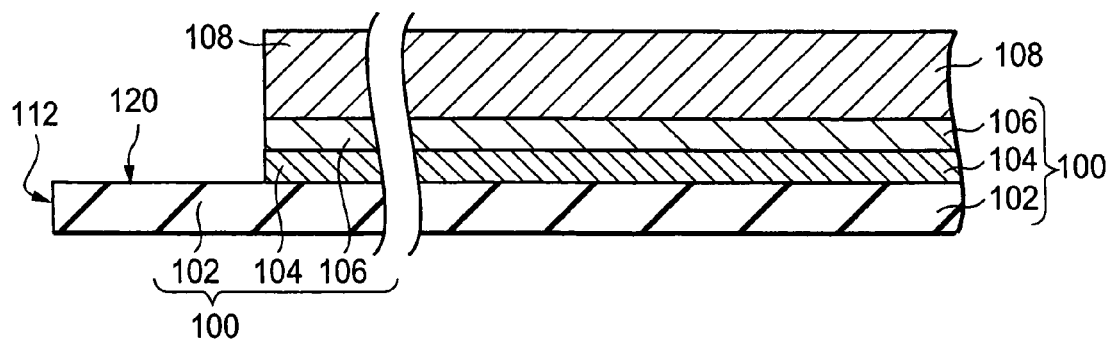

Next, the exposed layered portion of the interlayer insulating film 108 and the wafer edge region provided on its lower side, of the SOI wafer 100 are dry-etched with the resist pattern 110a as a mask to thereby expose an edge surface region 120 of the Si support substrate 102 (see FIG. 1(D)).

Figure 2A:
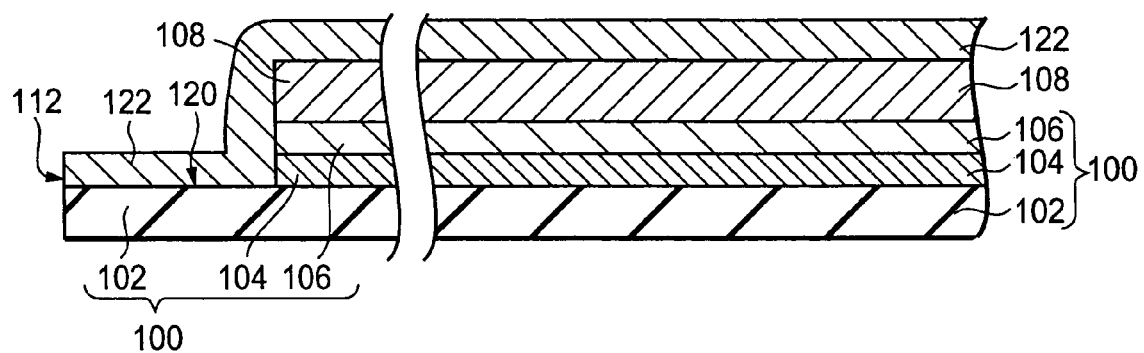
FIGS. 2(A) through 2(B) are respectively process diagrams following the process of FIG. 1(D)

Next, the resist pattern 110a is removed and a conductive layer 122 constituted as each wiring by a subsequent process step is deposited or grown by sputtering so as to cover the exposed edge surface region 120 and the remaining BOX layer 104 used as the intermediate insulating layer from the upper side (see FIG. 2(A)). In the present embodiment, the conductive layer 122 is formed so as to cover the whole span of the upper surface of the remaining wafer 100. That is, the conductive layer 122 is continuously formed so as to extend from the upper surface of the interlayer insulating film 108 to the exposed surface of the Si support substrate 102 through its side surface.

Figure 2B:
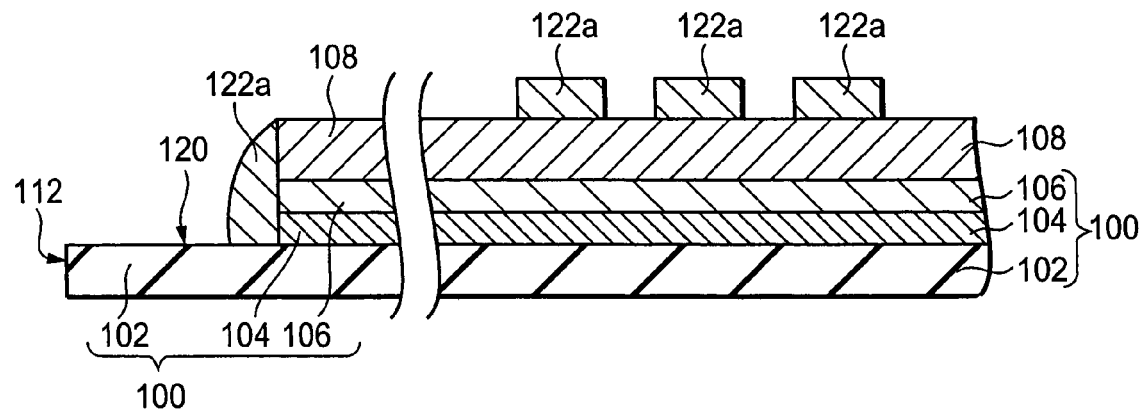

Then, the conductive layer 122 is patterned into wirings 122a by the known photolitho-etching technology (see FIG. 2(B)).

Figure 4:
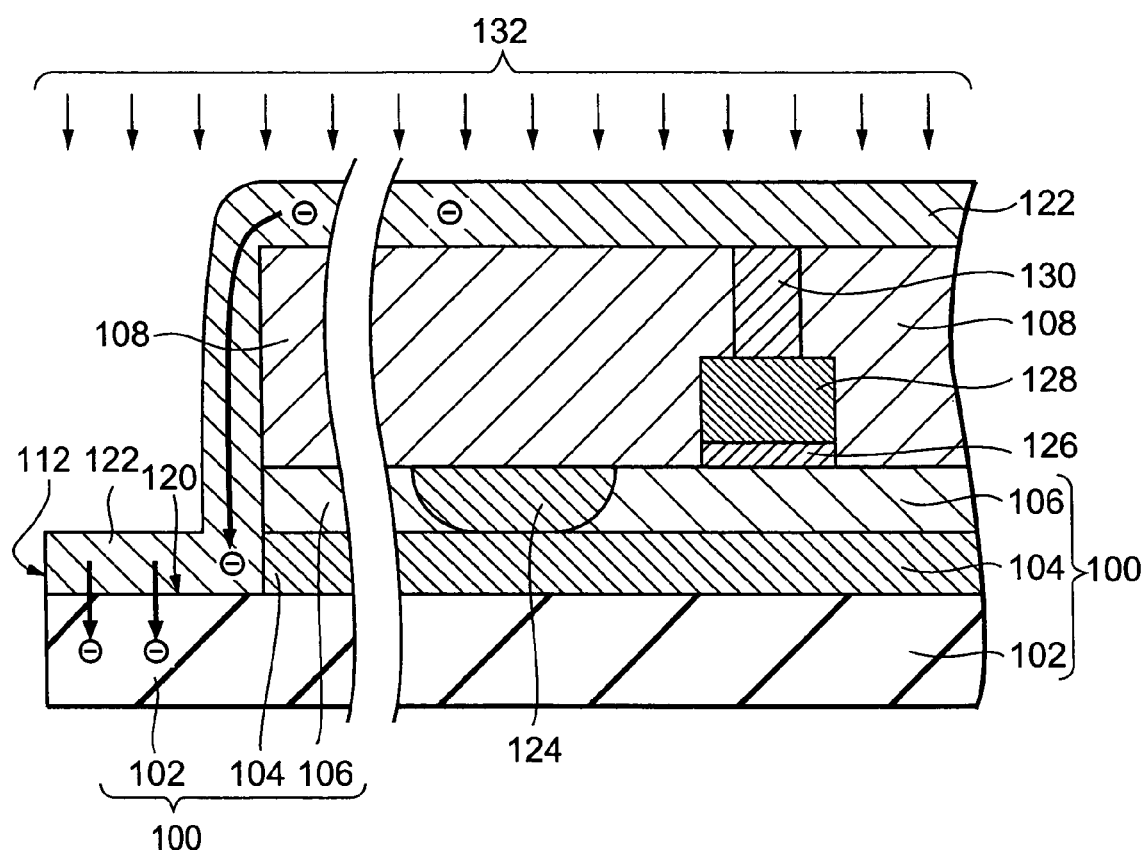
FIG. 4 is a diagram for describing the transfer of electrical charges during sputtering.
Figure 6:
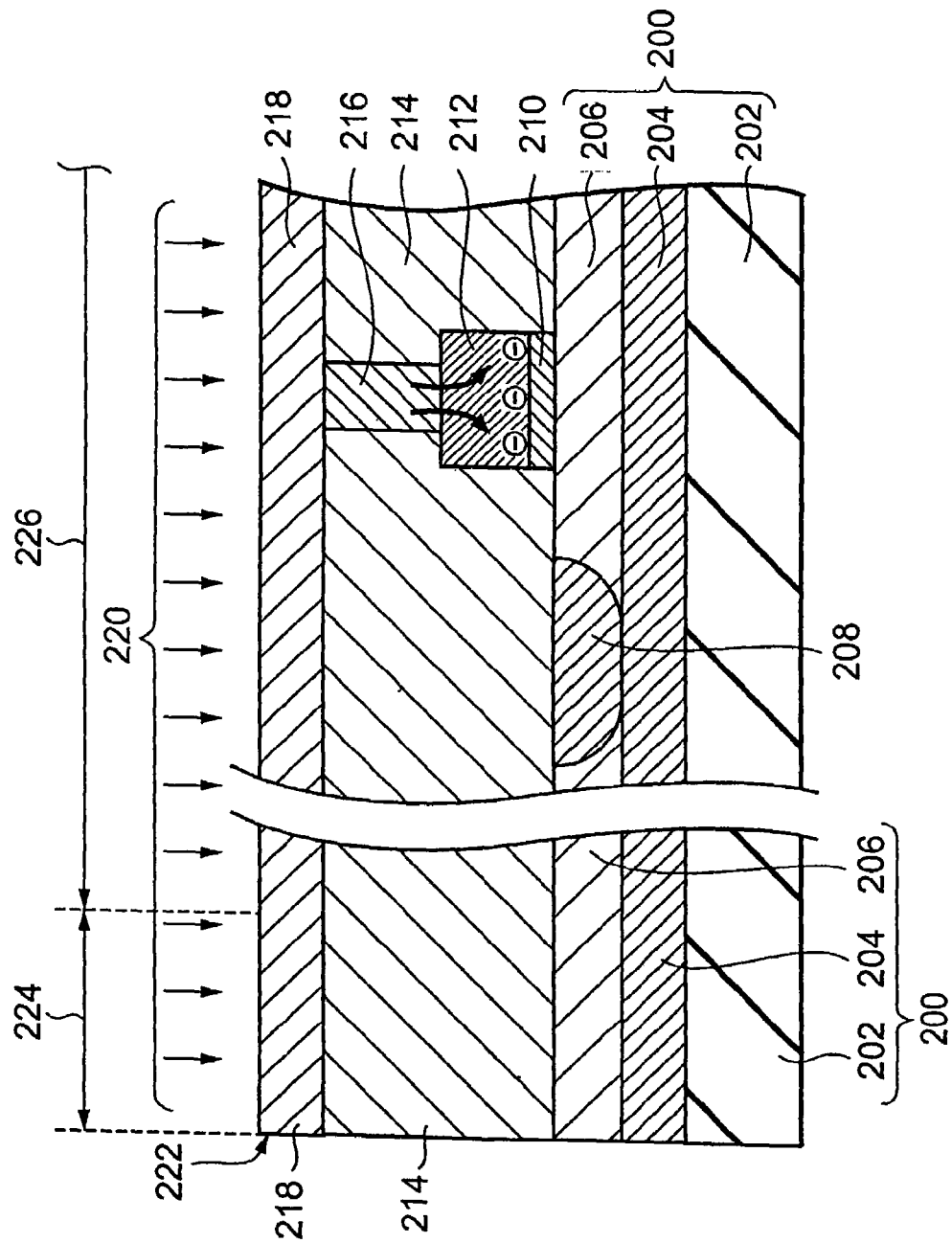
FIG. 6 is a diagram for describing a process for manufacturing a conventional semiconductor device.

FIG. 4 is a diagram for describing the transfer of electrical charges during sputtering in the first embodiment. The figure also illustrates even the interlayer isolation region 124 formed in the SOI layer 106, gate insulating film 126, gate electrode 128 and contact 130 all of which have been omitted from the explanatory diagram of the manufacturing process. Since the conduction made to the Si support substrate has been shut off by the BOX oxide film upon formation of the conductive layer by conventional sputtering shown in FIG. 6, the electrical charges developed by sputtering have been stored. In the first embodiment in contrast to it, the conductive layer 122 is formed by sputtering after the surface of the wafer edge region of the Si support substrate 102 has been exposed. Accordingly, the electrical charges stored in the conductive layer 122 by the injection 132 thereof by sputtering flow from the edge surface region 120 brought into contact with the conductive layer 122 of the Si support substrate to the Si support substrate 102. That is, since the charges move, no electrical charges are accumulated in the conductive layer 122. It is thus possible to prevent malfunctions developed in each device, such as an electrical breakdown of the gate insulating film, etc.

It is also possible to allow electrical charges produced upon dry etching in the pattering process of the wirings 122a to escape to the Si support substrate 102 because the conductive layer 122 is placed in a state of being connected to the Si support substrate 102 up to the stage in the middle thereof. It is thus possible to reduce the storage of the electrical charges even in such an etching process as compared with the conventional manufacturing method.

In the first embodiment, the peripheral exposure function of the exposure system has been used to form the resist pattern 110a excluding the resist edge region of the resist film in the wafer edge region. A spin coating apparatus used to coat the resist film may be utilized as the method for forming the resist pattern 110a.

In general, the spin coating apparatus is provided with the function of dropping chemicals only onto a wafer edge region to thereby remove a resist. Thus, the resist film 110 is coated by the spin coating apparatus and thereafter the resist film portion in the resist edge region is dissolved by the chemicals to remove it, after which exposure is effected over the whole surface of the resist film. In this case, a negative type resist is used as the material for the resist film to form the exposed portion of the resist film as the resist pattern 110a. As the chemicals for removing the resist film, may be used, for example, PGMEA (Propylene Glycol Monomethyl Ether Acetate). After its exposure, development processing is done to make it possible to form the resist pattern 110a over the surface of the wafer except for the wafer edge region.

Referring also to FIG. 3, the wafer is simplified in shape and represented in a circle as viewed on a plane basis from the upper side of the wafer. A cut-away portion such as OF (Orientation Flat), a notch or the like is actually defined in a general wafer. Since a wafer edge is partly linear as viewed on a plane basis from the surface of the wafer provided with the OF, chemicals might not successfully be dropped onto the corresponding resist film when a resist in a wafer edge region is removed by the spin coating apparatus. Thus, the resist pattern 110a may more preferably be formed using the peripheral exposure function in the case of the wafer provided with the OF.

When the embodiment of the present invention is applied to a multilayered wiring, a wiring conductive layer at each layer is made conductive to a supporting body if the process of exposing the surface of the supporting body in a wafer edge region is performed every time before sputtering of the wiring conductive layer. It is, therefore, possible to prevent the storage of electrical charges by sputtering.

According to the first embodiment of the present invention, as described above, the edge surface region corresponding to the wafer edge region of the Si support substrate 102 is exposed in the wiring process at the formation of the semiconductor device on the SOI wafer and thereafter the conductive layer 122 is formed by sputtering. Therefore, the electrical charges can be transferred from the edge surface region 120 of the Si support substrate 102 brought into contact with the conducive layer 122 to the Si support substrate 102. It is thus possible to avoid the storage of the charges in the device, reduce a malfunction such as dielectric breakdown or the like and prevent yield degradation of the device due to charge up.

<Second Embodiment>

The present invention can be applied to the process of sputtering an upper portion of an insulator or insulating layer formed on a supporting body formed of a semiconductor material or a conductive material. The first embodiment has described one example of the wiring formation of the semiconductor element or device formed on the SOI wafer in which the supporting body is formed of the semiconductor material. In contrast, the second embodiment will explain a case in which a capacitor of an MIM (Metal-Insulator-Metal) structure wherein a supporting body is constituted of a conductive material, is formed.

Figure 5A:
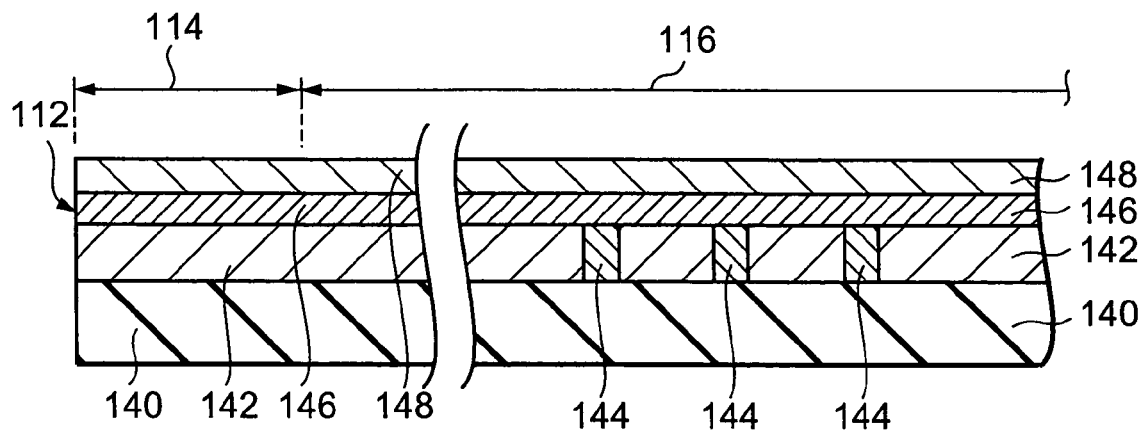
FIGS. 5(A) through 5(C) are respectively process diagrams for describing a method for manufacturing a semiconductor device, according to a second embodiment of the present invention.
Figure 5B:
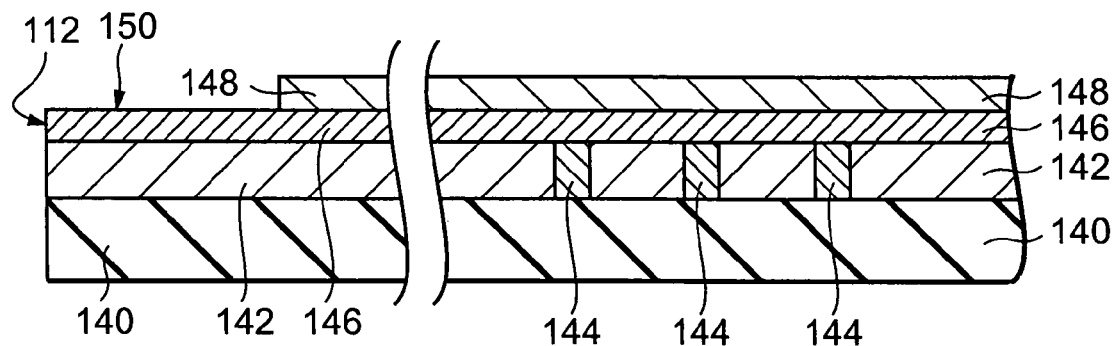
Figure 5C:
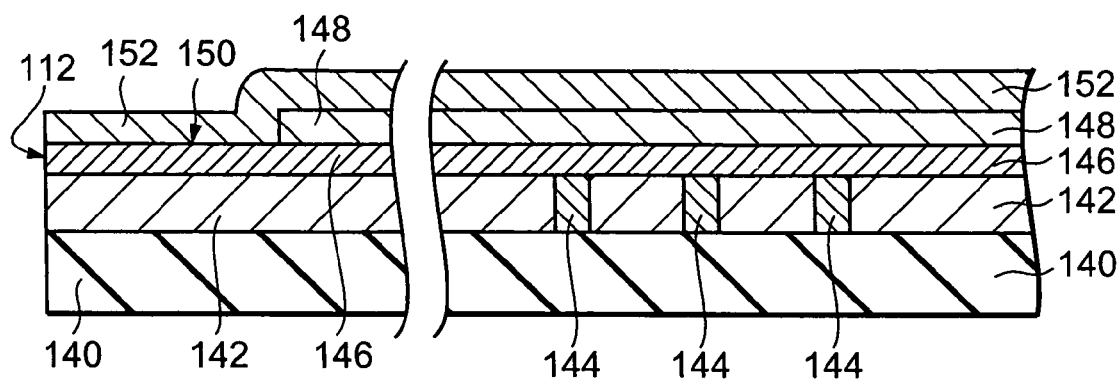

Referring to FIG. 5, a description will be made of an example in which the capacitor of the MIM structure is formed on an Si wafer 140. A description will be made here of an example wherein a supporting body is used as a lower metal layer 146 made of a conductive material, an insulating layer is used as an intermediate insulating film 148 and a conductive layer is used as an upper metal layer 152 formed by sputtering.

An interlayer insulating film 142 is deposited on the whole upper surface of the Si wafer 140, and contacts 144 for bringing a capacitor (not shown) formed in a subsequent process into conduction are formed in the interlayer insulating film 142.

The lower metal layer 146 is formed on the interlayer insulating film 142 as the supporting body by sputtering.

Since electrical charges can be transferred to the Si wafer 140 through the contacts 144, there is no need to take into consideration malfunctions due to the storage of the electrical charges upon such sputtering.

Next, an intermediate insulating film 148 is deposited over the entire upper surface of the lower metal layer 146 (see FIG. 5(A)).

In a manner similar to the first embodiment, a resist pattern 110a is formed only in a device forming region 116 excluding a wafer edge region 114. A layered portion of the intermediate insulating film 148, which is exposed from the resist pattern 110a, is removed by dry etching to expose an edge surface region 150 of the lower metal layer 146. Thereafter, the resist pattern 110a is removed (see FIG. 5(B)).

Next, an upper metal layer 152 is formed over the entire upper surface of the remaining wafer by sputtering so as to extend over the edge surface region 150 of the lower metal layer 146, which has been exposed from the intermediate insulating film 148. Since the electrical charges are moved toward the lower metal layer 146 through the exposed edge surface region 150 of the lower metal layer 146 in the course of such sputtering, the storage of the charges by sputtering can be prevented.

Next, the lower metal layer 146, the intermediate insulating film 148 and the upper metal layer 152 are patterned by the known photolitho-etching technology so that the corresponding capacity of MIM structure can be formed (not shown).

As described above, the electrical charges stored on the upper side of the insulating layer upon sputtering of the conductive layer by means of the insulating layer formed on the supporting body formed of the conductive material can be transferred to the supporting body by exposing the surface of the supporting body by etching. It is thus possible to reduce a malfunction caused by the storage of the charges and prevent degradation of a device's yield.

The exposure of the surface of the supporting body, which is made prior to sputtering of the conductive layer, needs not necessarily be effected on the full circumference of the wafer edge region. However, when the resist pattern formed by the peripheral exposure effected on the wafer edge region or the resist-film peeling as in the above-described embodiment is used, it is preferable to expose the surface of the supporting body in the wafer edge region over the entire circumference of the wafer because it becomes easy to operate.

If the region for exposing the surface of the supporting body, i.e., the edge surface region is taken as all regions except for the region in which the device in the device forming region is formed (patterned), then a step corresponding to the thickness of the film removed by etching occurs outside the device formed on the outermost periphery. There is a possibility that when such a step exists on the surface of the wafer where each pattern is formed on a submicron scale, a pattern abnormality due to defocus will occur on its periphery and yield will be degraded at the device formed on the outermost periphery. Thus, the region for exposing the surface of the supporting body may preferably be set to the peripheral region extending to about 5 mm from the wafer edge to the center of the wafer, i.e., the wafer edge region.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method for manufacturing a semiconductor device, comprising the steps of, upon processing a wafer to have a support substrate, a buried oxide film provided over an entire upper surface of the support substrate, a silicon on insulator layer provided over an entire upper surface of the buried oxide film, and an intermediate insulating film provided over an entire upper surface of the silicon on insulator layer to thereby fabricate the semiconductor device:
    (a) removing a layered portion of the intermediate insulating film, the silicon on insulator layer and the buried oxide film provided on a wafer edge region lying around the wafer, by etching using a resist pattern to thereby expose an edge surface region of the support substrate, which corresponds to the wafer edge region; and
    (b) forming a conductive layer by sputtering so as to cover said exposed edge surface region and the intermediate insulating film.

2. The method according to claim 1, wherein the resist pattern is formed prior to said step (a) as including,
    a step for forming a resist film over an entire upper surface of the intermediate insulating film,
    a step for effecting a peripheral exposure on a resist film edge region corresponding to the wafer edge region, by using a peripheral exposure function of an exposure system, and
    a step for removing the resist film edge region subjected to the peripheral exposure.

3. The method according to claim 2, wherein the support substrate is formed of a semiconductor material.

4. The method according to claim 1, wherein the resist pattern is formed prior to said step (a) as including,
    a step for forming a resist film over an entire upper surface of the intermediate insulating film, and
    a step for applying chemicals onto an upper surface of the resist film by a spin coating apparatus to remove a resist film edge region corresponding to the wafer edge region.

5. The method according to claim 4, wherein the support substrate is formed of a semiconductor material.

6. The method according to claim 1, wherein the support substrate is formed of a semiconductor material.

7. A method of manufacturing a semiconductor device comprising:
    providing an SOI wafer as having a substrate, an oxide film on the substrate, and a silicon layer on the oxide film;
    forming a gate element on the silicon layer;
    depositing an insulating layer over the gate element and the silicon layer;
    forming a contact through the insulating layer to the gate element, the contact being exposed at a surface of the insulating layer;
    removing the insulating layer, the silicon layer and the oxide film from an edge region of the SOI wafer, to thereby expose an edge surface region of the substrate; and
    sputtering a conductive layer on the insulating layer, the contact exposed at the surface of the insulating layer, and the edge surface region of the substrate.

8. The method of manufacturing a semiconductor device of claim 7, wherein said removing the insulating layer, the silicon layer and the oxide film comprises:

forming a resist layer on an entirety of the surface of the insulating layer and on the contact exposed at the surface of the insulating layer;

peripherally exposing an edge region of the resist layer; and removing the exposed region of the resist layer to form a patterned resist.

9. The method of manufacturing a semiconductor device of claim 8, wherein said removing the insulating layer, the silicon layer and the oxide film further comprises etching using the patterned resist as a mask.

10. The method of manufacturing a semiconductor device of claim 7, wherein said removing the insulating layer, the silicon layer and the oxide film comprises:

forming a resist layer on an entirety of the surface of the insulating layer and on the contact exposed at the surface of the insulating layer; and spin coating chemicals onto the surface of the insulating layer to remove an edge region of the resist layer above the edge surface region of the substrate and form a patterned resist.

11. The method of manufacturing a semiconductor device of claim 10, wherein said removing the insulating layer, the silicon layer and the oxide film further comprises etching using the patterned resist as a mask.

12. The method of manufacturing a semiconductor device of claim 7, wherein the substrate is a semiconductor layer.

13. The method of manufacturing a semiconductor device of claim 7, wherein said forming a gate element comprises:

forming a gate insulating film on the silicon layer; and forming a gate electrode on the gate insulating film.

* * * * *